United States Patent

Konno et al.

Patent Number: 5,770,853
Date of Patent: Jun. 23, 1998

[54] PULSE GENERATOR AND PULSE GENERATION METHOD HAVING MAXIMIZED PULSE HEIGHT

[75] Inventors: Takeshi Konno; Hitoshi Ujiie, both of Tokyo, Japan

[73] Assignee: Advantest Corporation, Tokyo, Japan

[21] Appl. No.: 746,841

[22] Filed: Nov. 18, 1996

[30] Foreign Application Priority Data

Nov. 20, 1995 [JP] Japan .................................. 7-301552

[51] Int. Cl.[6] ...................................................... H01J 40/14
[52] U.S. Cl. ........................... 250/214 LS; 250/214 R; 324/676; 372/30; 257/664
[58] Field of Search ........................ 250/214.1, 214 LS, 250/214 R; 324/676, 96, 753; 356/221, 222, 226; 372/30, 31, 33, 38; 257/664, 21, 22, 82

[56] References Cited

U.S. PATENT DOCUMENTS 4,822,991  4/1989  Riggs et al. ........................ 250/214 R Primary Examiner—Que Le
Attorney, Agent, or Firm—Oblon, Spivak, McClelland, Maier & Neustadt, P.C.

[57] ABSTRACT

A pulse generator is provided with a photoconductor in which first to third transmission lines composed of conductive film are formed on a semi-insulating substrate and the transmission lines are separated by first and second narrow gaps, and provides short pulses from short electrical pulses generated on these transmission lines in accordance with short optical pulses irradiated upon each narrow gap. Semiconductor lasers effect the irradiation of short optical pulses upon the first and second narrow gaps. A delay is conferred upon short optical pulses irradiated upon one of the first and second narrow gaps such that pulse height of short electrical pulses generated on the first to third transmission lines is maximized.

11 Claims, 6 Drawing Sheets

PULSE GENERATOR AND PULSE GENERATION METHOD HAVING MAXIMIZED PULSE HEIGHT

BACKGROUND OF THE INVENTION

1. Field of the Invention

The present invention relates to a pulse generator and pulse generation method for use in the fields of measurement or communication. In concrete terms, the present invention relates to a pulse generator and pulse generation method used in, for example, high-speed sampling devices and radar.

2. Description of the Related Art

Conventionally, this type of pulse generator employs, for example, Schottky diodes, and is constructed so as to generate short pulses using an electrical circuit. In a pulse generator that generates short pulses by an electrical circuit, pulse width is limited to the order of at most several tens of picoseconds (ps), and difficulties are encountered in generating short pulses of yet narrower pulse width. Moreover, although comb generators exist that are capable of generating short pulses having a pulse width on the order of 40 ps, the generation of short pulses produced by electrical circuits also gives rise to overshoot or ringing whereby a clear pulse waveform is difficult to obtain.

Compared with the electrical generation of short pulses described hereinabove, short pulses of still narrower pulse width can be readily obtained by optical generation. Devices have been proposed which employ an O/E conversion (optoelectric conversion) means into which short optical pulses (optical pulses of narrow pulse width) are irradiated to obtain short electrical pulses.

FIG. 1 is a circuit diagram showing an example of the construction of one pulse generator employing this O/E conversion. Load resistance 131 is connected to PD (photo diode) 130, the other end of this resistance 131 being grounded. Reverse bias voltage is impressed to the opposite end of PD 130. In addition, short optical pulses emitted from optical fiber 120 are irradiated through object lens 121 and upon PD 130.

In the above-described pulse generator, when the short optical pulses emitted from optical fiber 120 pass through object lens 121 and are irradiated upon PD 130, short electrical pulses are generated in resistance 131 in accordance with the short pulses of the irradiated light, and short electrical pulses are obtained from output terminal 133.

Nevertheless, the above-described pulse generators of the prior art entail some drawbacks. Generally, the frequency range of a photodiode is on the order of 10 GHz, and as a result, the junction capacitance in a prior-art pulse generator is considerable, reaching a level of several pF (picofarads). Although short electrical pulses can be generated in accordance with the short optical pulses in a prior-art pulse generator having such large junction capacitance, the pulse width widens upon conversion of the short optical pulses to short electrical pulses, and as a result, the obtainable pulse width is limited to approximately 100 ps. A short pulse width on the order of 10 ps therefore cannot be obtained with a prior-art pulse generator, and pulse generator capable of obtaining this range of pulse width are not yet available.

SUMMARY OF THE INVENTION

The object of the present invention is to provide a pulse generator and pulse generation method that solves the above-described problems and by which short electrical pulses having a pulse width equivalent to that of short optical pulses can be obtained.

To achieve the above-described object, a pulse generator of the present invention includes:

an electrical pulse generation means that is provided with a photoconductor in which first to third transmission lines made up of conductive film are formed on a semi-insulating substrate and the transmission lines are separated by first and second narrow gaps, and that generates short electrical pulses on the first to third transmission lines according to short optical pulses irradiated upon each narrow gap;

short optical pulse irradiation means that is provided with a semiconductor laser and that irradiates short optical pulses upon the first and second narrow gaps; and delay means that gives a delay to short optical pulses irradiated upon one of the first and second narrow gaps such that pulse height of short electrical pulses generated on the first to third transmission lines is maximized.

In the above-described case, the delay means may be a device that varies the optical path length of short optical pulses irradiated upon one of the first and second narrow gaps.

In addition, the photoconductor may be a device constructed such that reverse-bias voltage is impressed to one end of the first transmission line, and short electrical pulses generated on the first to third transmission lines are outputted from the third transmission line, and in which first to third transmission lines are formed in a straight line.

Moreover, the above-described photoconductor may also be constructed such that reverse-bias voltage is impressed to one end of the first transmission line, the short electrical pulses generated on the first to third transmission lines are outputted from the third transmission line, the first and second transmission lines are formed in a line, one end of the second transmission line is grounded by way of a resistance and a diode, and the third transmission line is formed in a direction that forms a right angle with the second transmission line.

Further, the above-described semiconductor laser may be a surface emitting laser diode, and the substrate upon which the surface emitting laser diode is formed may be secured to the photoconductor by means of solder bumps.

Further, the above-described short optical pulse irradiation means may include first and second semiconductor lasers that irradiate the first and second narrow gaps, respectively; and the above-described delay means may be a device that electrically delays short optical pulses emitted from one of the first and second semiconductor lasers. In this case, the first and second semiconductor lasers may be surface emitting laser diodes, and the substrate on which these surface emitting laser diodes are formed may be secured to the photoconductor by means of solder bumps.

In addition, a plurality of any of the above-described pulse generators may be connected in parallel, and constructed such that the short electrical pulses outputted by these pulse generators are multiplied.

To achieve the above-described object, according to the pulse generation method of the present invention, using a photoconductor in which first to third transmission lines made up of a conductive film are formed on a semi-insulating substrate and the transmission lines are separated by first and second narrow gaps, short optical pulses are irradiated upon the first and second narrow gaps to bring about generation of first and second electrical pulses on the first to third transmission lines that accord with the short optical pulses, and these first and second electrical pulses are multiplied to obtain short electrical pulses; and the short optical pulses irradiated upon one of the first and second narrow gaps are delayed so as to maximize the pulse height of the obtained short electrical pulses.

In the above-described case, the delay may be conferred by varying the optical path length of short optical pulses irradiated upon one of the first and second narrow gaps.

Alternatively, first and second semiconductor lasers that irradiate the first and second narrow gaps, respectively, may be employed, and the delay may be performed by conferring an electrical delay to one of the first and second semiconductor lasers.

According to the present invention as described hereinabove, a first electrical pulse is generated by irradiating short optical pulses upon a first narrow gap provided between first and second transmission lines, a second electrical pulse is generated by irradiating short optical pulses upon a second narrow gap provided between second and third transmission lines, and the first and second electrical pulses thus generated are multiplied. Delay means confers a delay on the short optical pulses irradiated onto one of the narrow gaps such that the pulse height of the multiplied short electrical pulses is maximized. The half power width of electrical pulses multiplied in this way is the pulse width of short electrical pulses obtained from this pulse generator, and this pulse width is smaller than the first or the second electrical pulses.

In devices within the scope of the present invention in which the first and second transmission lines are formed in a line and the third transmission line is formed in a direction forming a right angle with the second transmission line, one end of the second transmission line is grounded by way of a resistance and a diode, and as a result, electrical pulses generated on the first and second transmission lines are not reflected at the end of the second transmission line. This elimination of the effect of reflection of generated electrical pulses at the end of the transmission line can provide a more stable pulse generator.

In devices within the scope of the present invention in which a plurality of pulse generators are connected in parallel, short electrical pulses outputted from each of the pulse generators can be multiplied, thereby decreasing the pulse width of obtained short electrical pulses.

In addition to these effects, devices within the scope of the present invention in which a surface emitting laser diode is formed on a substrate and this substrate is secured to the photoconductor allow a monolithic construction that provides greater freedom in design.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS

Embodiments of the present invention will next be described with reference to the accompanying figures.

First Embodiment

Figure 1:
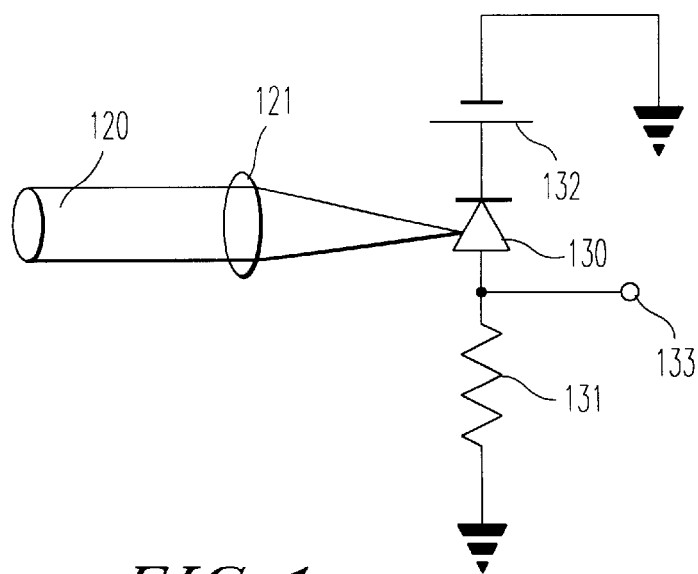
FIG. 1 is a circuit diagram showing the construction of one example of a prior-art pulse generator.
Figure 2:
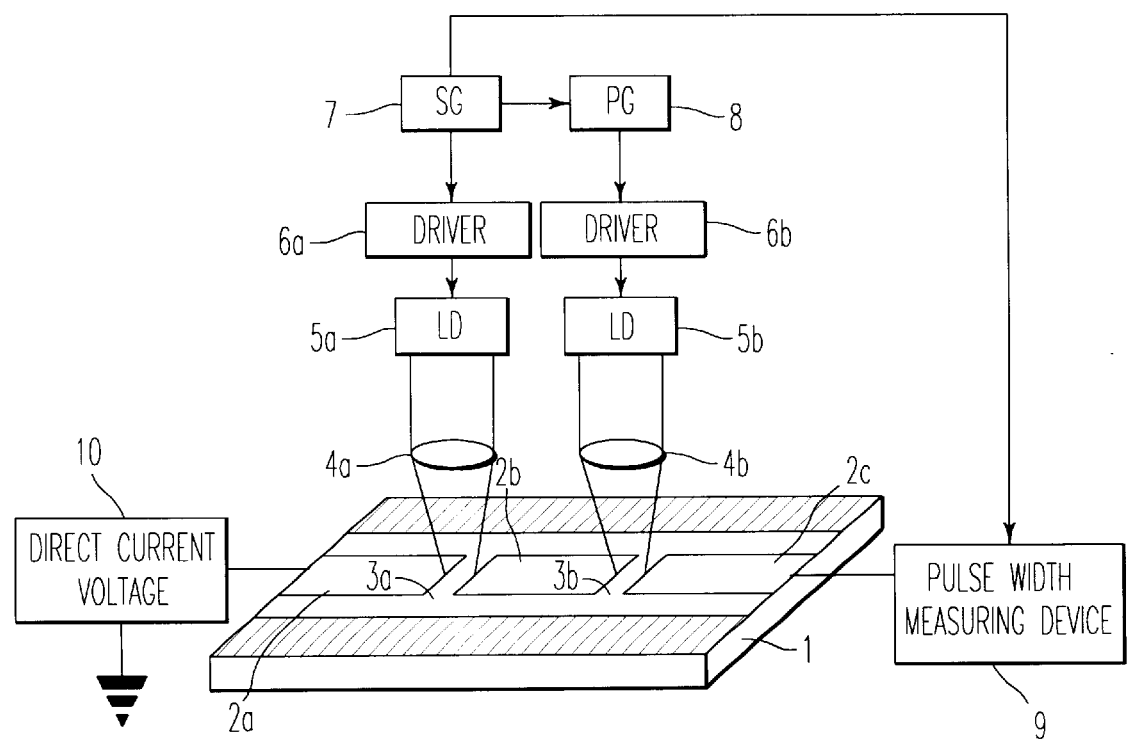
FIG. 2 is a schematic view showing the construction of the first embodiment of the pulse generator of the present invention.

FIG. 2 is a schematic representation of the construction of the first embodiment of the pulse generator of the present invention. In FIG. 2, transmission lines 2$a$–2$c$ composed of a conductive film separated by narrow gaps are formed in a line on semi-insulating substrate 1. As the semi-insulating substrate 1, a semi-insulator such as an InP (indium phosphide) substrate doped with Fe (iron) may be used. The transmission lines are coplanar lines with a characteristic impedance of generally 50 Ω formed by evaporation of a conductor such as gold (Au) along the centerline of the substrate. A semi-insulator is ordinarily an insulator, but in this case, it is a substance that becomes a conductor when irradiated by light. Furthermore, the characteristic impedance of the coplanar lines is determined by such factors as the substrate material, the transmission line width, and the separation from the earth line, and is not necessarily limited to 50 Ω. The characteristic impedance is preferably matched to the design of the overall system and can be, for example, 75 Ω.

The portions between the above-described transmission lines, i.e., the opposing portions of the conductive films which are separated by narrow gaps on the order of several μm, are photoconductor sections. Here, the portion made up by transmission lines 2$a$ and 2$b$ is first photoconductor section 3$a$, and the portion made up by transmission lines 2$b$ and 2$c$ is second photoconductor section 3$b$. When light is irradiated into semi-insulating substrate 1 from the gaps, the resistance value between the transmission lines changes in accordance with the incident light in the first and second photoconductor sections 3$a$ and 3$b$.

Direct-current voltage 10, to which is connected a feedback line, is connected to one end of the transmission line (i.e., the end portion of transmission line 2$a$), thereby allowing application of a reverse direct-current bias. In addition, a pulse width measuring device 9 is connected to the other end of the transmission line (i.e., the end portion of transmission line 2$c$). This pulse width measuring device 9 measures the width of electrical pulses generated in the transmission lines using as a trigger signals from SG (Signal Generator) 7 (to be described hereinbelow).

A short optical pulse generating means that irradiates short optical pulses is provided in the above-described photoconductor sections. Particulars of the construction of this pulse generating means are described hereinbelow.

An optics system that irradiates short optical pulses and that is made up of condenser lens 4a and LD (laser diode) 5a is arranged at a position over first photoconductor section 3a. Similarly, an optics system that irradiates short optical pulses and that is made up of condenser lens 4b and LD 5b is arranged at a position over second photoconductor section 3b. LD 5a and LD 5b are driven by drivers 6a and 6b, respectively.

A known gain switching method and mode locking method are used in the generation of short optical pulses by the LD. For example, in the gain switching method, electrical pulses having a pulse width on the order of 100 ps are injected to an LD, thereby causing gain within the LD resonator to rise abruptly and generate transient oscillation (relaxation oscillation), and short optical pulses are generated using the optical output of this transient oscillation. Short optical pulses having a pulse width on the order of 10 ps can be obtained by this method. Moreover, by using an LD of short resonator length such as a surface emitting LD, short optical pulses having a pulse width on the order of 1 ps or less can be generated.

Driver 6a drives LD 5a based on signals from SG (signal generator) 7, and driver 6b drives LD 5b based on signals from PG (pulse generating section) 8. This PG 8 is a delay means and is constructed so as to generate pulses based on signals from SG 7, and in this case, outputs signals delayed a prescribed amount from signals from SG 7. The amount of delay in PG 8 is set to a value such that the pulse width detected in pulse width measuring device 9 described hereinabove is a minimum. Alternatively, a delay circuit (for example, a circuit made up of a variable resistance and capacitor) may also be employed in place of this PG 8.

In a pulse generator constructed according to the foregoing description, first short electrical pulses are generated in accordance with the irradiated short optical pulses at first photoconductor section 3a, second short electrical pulses are generated in accordance with irradiated short optical pulses at second photoconductor section 3b, and these first and second short electrical pulses are multiplied on the transmission lines. The short electrical pulses which are the multiplied result of the first and second short electrical pulses can be detected at pulse width measuring device 9. In this embodiment, the amount of delay in PG 8 is set such that the pulse width of short electrical pulses detected at pulse width measuring device 9 is a minimum, i.e., such that the pulse height of the multiplied short electrical pulses is maximized. Specifically, the amount of delay is set such that generation of second short electrical pulses is executed at second photoconductor section 3b when first short electrical pulses generated in first photoconductor section 3a arrive at second photoconductor section 3b. In this way, the pulse width (full width at half maximum: FWHM) of short electrical pulses, which are the multiplied result of first electrical pulses and second electrical pulses, is smaller than the original short electrical pulses. An explanation will next be given regarding the reduction of pulse width of short electrical pulses generated in such a pulse generator.

If short electrical pulses (first electrical pulses or second electrical pulses) generated at one photoconductor section are F(t), the obtained short electrical pulses F(g) (short electrical pulses which are the multiplied result of the first electrical pulses and second electrical pulses) can be represented by the following formula:

$$F(g) = F(t) \times F(t) = F(t)^2$$

If the waveform of short electrical pulses generated at one photoconductor section are given by:

$$F(t) = exp(A(t/T)^2)$$

(provided that A is a constant and T is pulse width) the FWHM is a pulse width that is ½ the peak value of the pulse, and therefore:

$$exp(A(t/T)^2) = \tfrac{1}{2}$$

when:

$$F(t) = \tfrac{1}{2}$$

Here:

$$exp(A(t)^2)$$

is constant, and therefore, the pulse width of short electrical pulses generated in one photoconductor section are:

$$T = 2 \qquad (1)$$

On the other hand, if the waveform of short electrical pulses, which are the result of multiplying first and second short electrical pulses, is given by:

$$F(g) = F(t)^2 = \left\{ \exp\left( A\left( \frac{t}{T} \right)^2 \right) \right\}^2$$

then:

$$\frac{1}{2} = \left\{ \exp\left( A\left( \frac{t}{T} \right)^2 \right) \right\}^2$$

$$\exp\left( A\left( \frac{t}{T} \right)^2 \right) \right\} = \frac{1}{\sqrt{2}}$$

when:

$$F(g) = \tfrac{1}{2}$$

i.e., when:

$$F(t)^2 = \tfrac{1}{2}$$

Because 1 exp (A (t)²) is fixed, the pulse width of multiplied short electrical pulses is:

$$T = \sqrt{2}$$

From the above formulas (1) and (2), the ratio of the pulse widths (half power widths) of the multiplied short electrical pulses to the original short electrical pulses is:

$$\frac{\sqrt{2}}{2} = \frac{1}{\sqrt{2}}$$

and the pulse width therefore is decreased by approximately 30% with respect to that of the original short electrical pulses.

Figure 3:
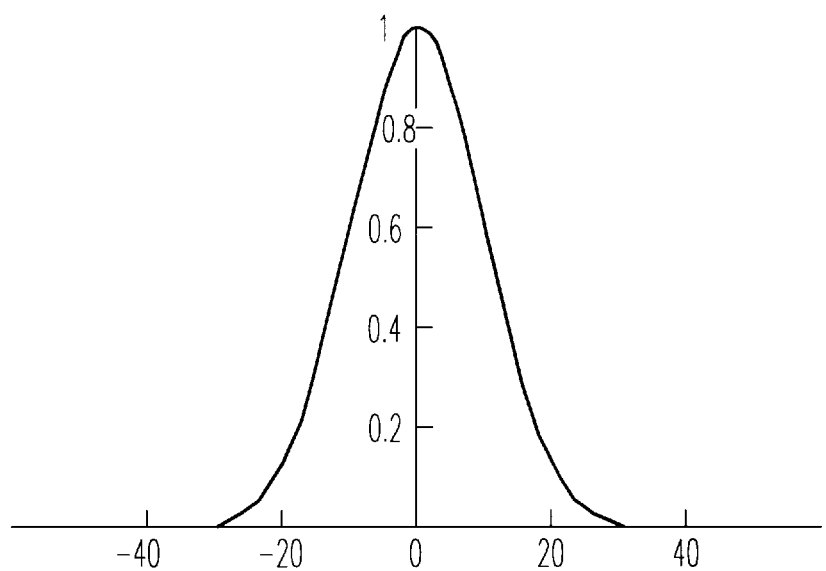
FIG. 3 is a waveform chart of pulses obtained after calculation for a prior-art pulse generator.
Figure 4:
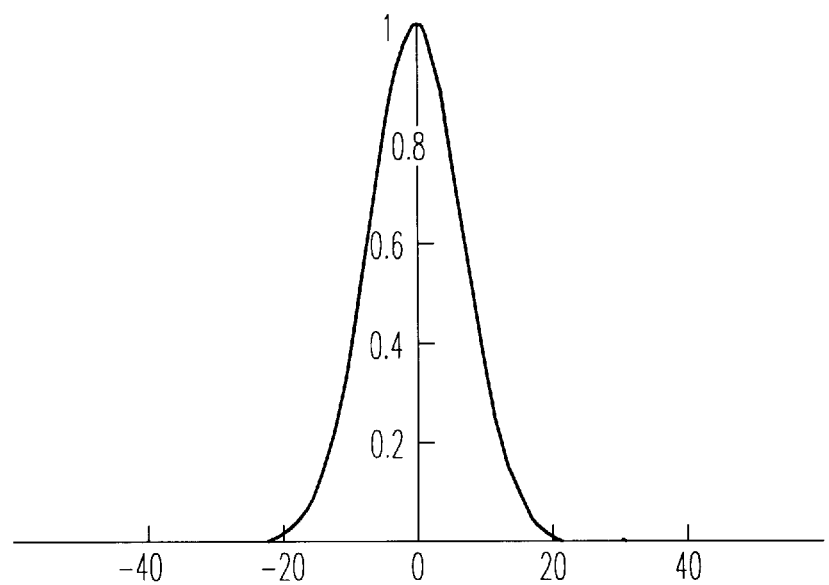
FIG. 4 is a waveform chart showing pulses obtained after calculation in the pulse generator shown in FIG. 2.

For the reasons described hereinabove, the short electrical pulse device of the present embodiment can further reduce pulse width compared with a prior-art short electrical pulse device having only one photoconductor section. Based on calculation, the present embodiment can provide a smaller pulse width as shown in FIG. 4 than the waveform shown in FIG. 3 produced by a prior-art pulse generator.

Figure 5:
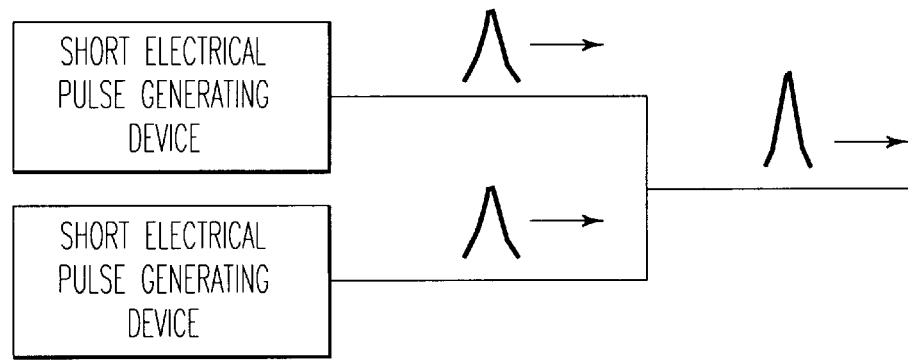
FIG. 5 shows the state of a pulse waveform for a case in which two of the pulse generators shown in FIG. 2 are connected in parallel.

In addition, as shown in FIG. 5, if two short electrical pulse generating devices provided with a photoconductors of the above-described construction are connected in parallel and their output is multiplied:

$$F(g) = \frac{1}{\sqrt{2}} \times \frac{1}{\sqrt{2}} = \frac{1}{2}$$

and the pulse width is reduced by about 50%. In this case, synchronization and delay processing of the output of each photoconductor are effected such that the pulse height of multiplied short electrical pulses is maximized.

Figure 6:
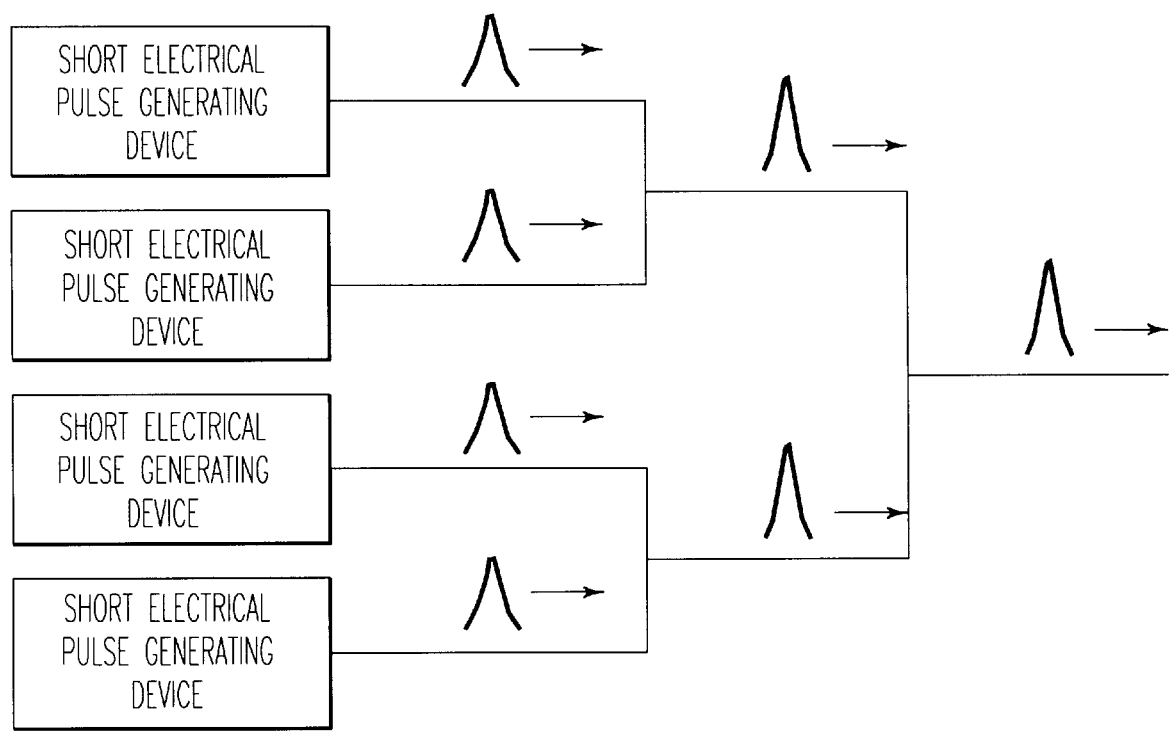
FIG. 6 shows the state of a pulse waveform for a case in which pulse generators shown in FIG. 2 are parallel connected in multistages.

In addition, if a plurality of photoconductors are connected in parallel and their outputs multiplied, pulse width can be further decreased. FIG. 6 shows one example in which two short electrical pulse generating devices equipped with photoconductors of the above-described construction are connected in parallel are established as one pair, and such pairs are further connected in parallel.

Figure 7A:
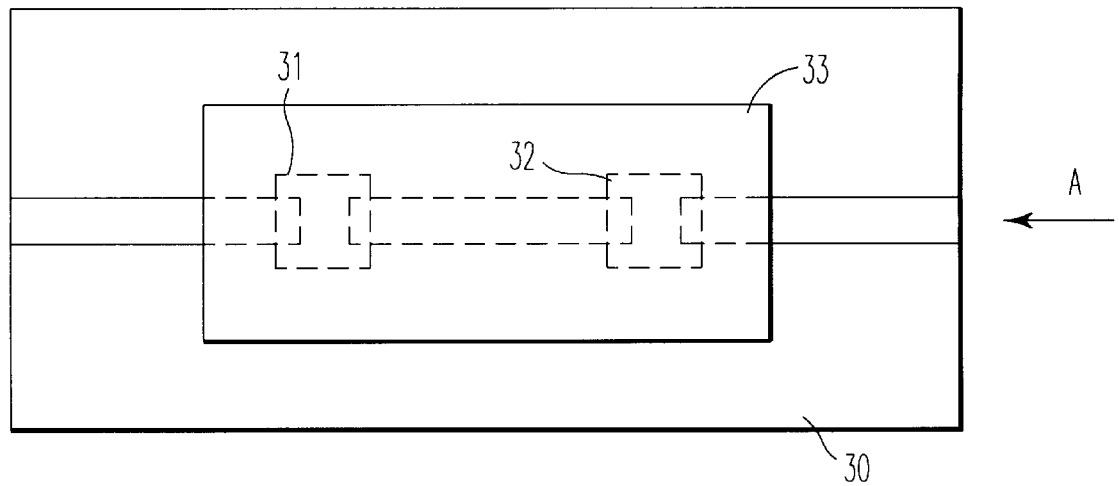
FIG. 7($a$) shows the upper plan view of a monolithic pulse generator, and FIG. 7($b$) is a view in the direction of arrow A in FIG. 7($a$).
Figure 7B:
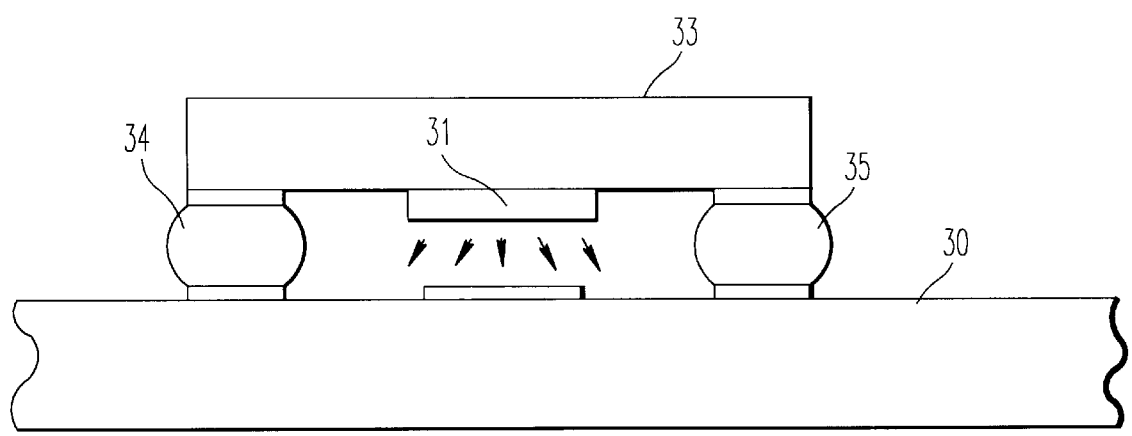

Moreover, the pulse generators described hereinabove adopt a construction in which laser diodes are provided apart from the photoconductor substrate, but the laser diodes can formed on the substrate to create a monolithic construction in which the laser diodes secured on the photoconductor substrate. For example, as shown in FIG. 7, an LD substrate 33 upon which two surface emitting laser diodes 31 and 32 are formed is secured to a photoconductor substrate 30 by solder bumps 34 and 35. In this case, each surface emitting LD is arranged so as to irradiate each photoconductor section on the photoconductor substrate 30.

Second Embodiment

The pulse generator according to the above-described first embodiment is constructed such that the delay of short optical pulses irradiated onto each photoconductor section is electrically adjusted. However, the delay adjustment of these short optical pulses can be effected by varying the optical path length of the optical system irradiating one photoconductor section. A pulse generator in which delay of short optical pulses is adjusted by varying the optical path length of the optical system is next described.

Figure 8:
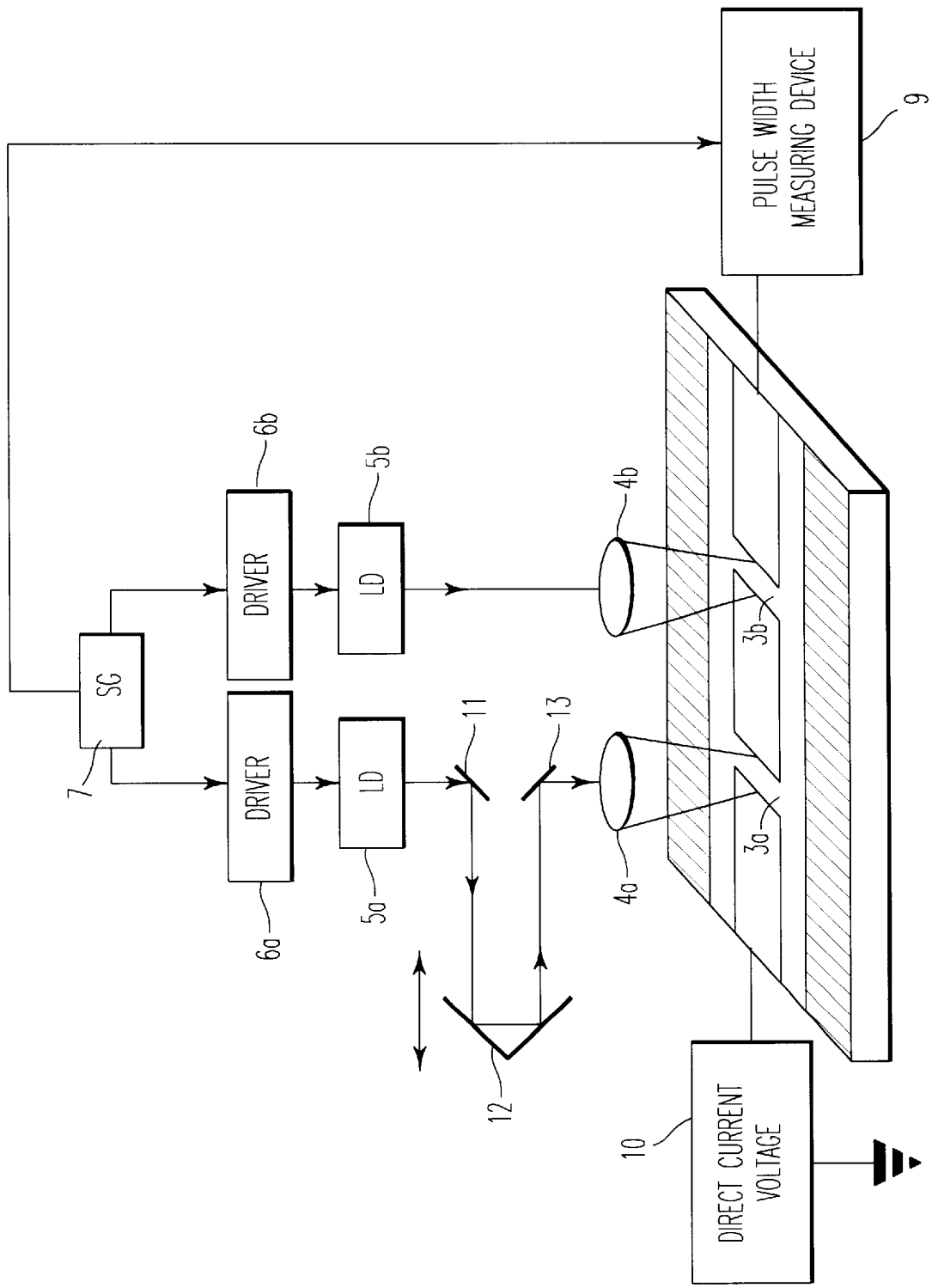
FIG. 8 is a schematic view showing the construction of the second embodiment of the pulse generator of the present invention.

FIG. 8 shows the schematic construction of a pulse generator of the second embodiment of the present invention. The pulse generator of this embodiment is of the same construction as the pulse generator shown in FIG. 2 with the exception that a variable means for varying the optical path length of the optical system irradiating one photoconductor section is provided in place of a pulse generating section. In the figure, equivalent constituent elements are identified by the same reference numerals.

Drivers 6a and 6b are constructed so as to drive LD 5a and LD 5b, respectively, based on signals from SG 7. An optical path length varying means for changing the optical path length is provided between LD 5a and condenser lens 4b. In other words, mirror 11 is arranged in the light path of laser light emitted from LD 5a, mirror unit 12 for turning back this laser light is arranged in the light path of laser light reflected by mirror 11, and mirror 13 is arranged in the light path of laser light turned back by mirror unit 12. Laser light reflected by mirror 13 is condensed by condenser lens 4a. Mirror unit 12 is constructed so as to be movable in the direction of the light path of laser light reflected by mirror 11, and the light path length can therefore be varied by moving this mirror unit 12.

In a pulse generator constructed according to the foregoing description, as for the case of the above-described first embodiment, first short electrical pulses are generated in accordance with the irradiated optical pulses at first photoconductor section 3a, second short electrical pulses are generated in accordance with the irradiated typical pulses at second photoconductor section 3b, and the first and second short electrical pulses are multiplied on the transmission lines. The short electrical pulses which are the multiplication of the first and second short electrical pulses can be detected at pulse width measuring device 9.

In this embodiment, variation of the optical path length is effected by mirror unit 12 so as to minimize the pulse width of short electrical pulses detected by pulse width measuring device 9. In other words, mirror unit 12 is used to vary the optical path length and adjust delay such that second short electrical pulses are generated at second photoconductor section 3b when first electrical pulses generated in first photoconductor section 3a arrive at second photoconductor section 3b.

The above-described construction eliminates the need for components that electrically generate a delay in the pulse generator of the first embodiment.

Third Embodiment

Although the pulse generator according to the above-described second embodiment is provided with two laser diodes, a construction employing one laser diode is also possible.

Figure 9:
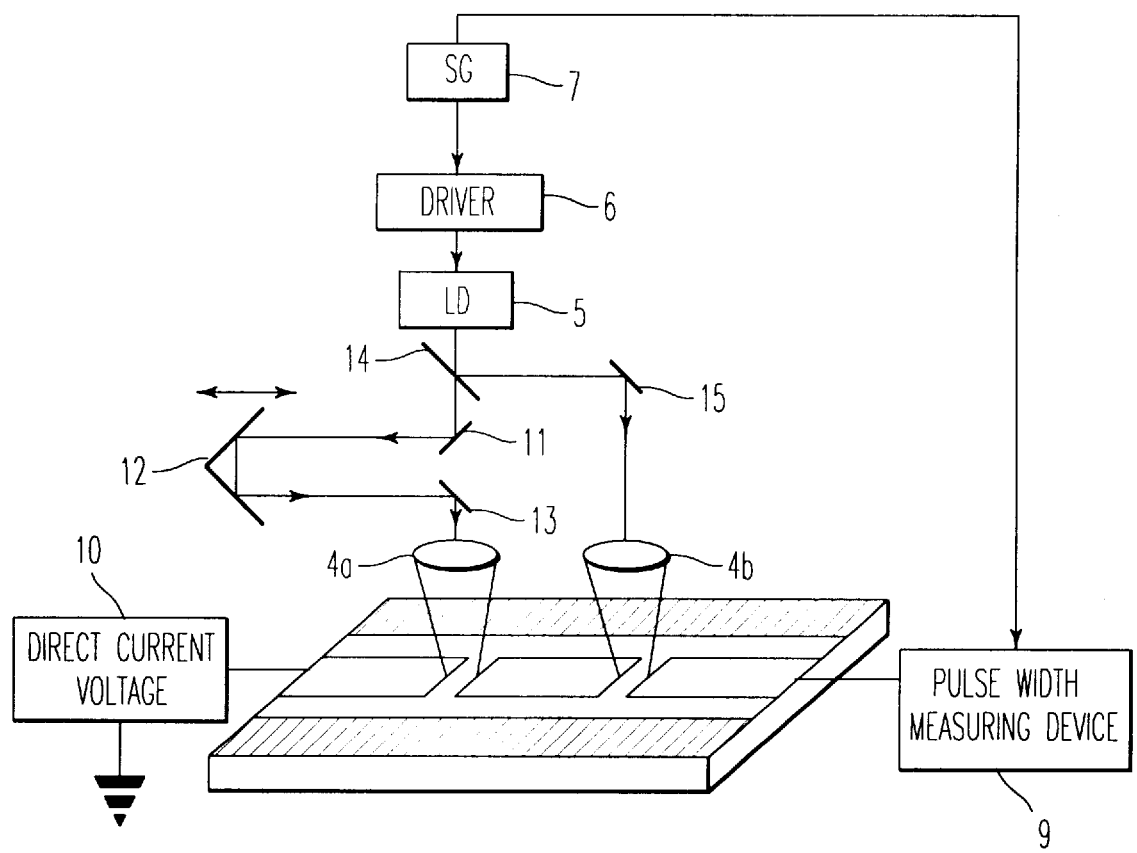
FIG. 9 is a schematic view showing the construction of the third embodiment of the pulse generator of the present invention.

FIG. 9 is a schematic view of the construction of the pulse generator of the third embodiment of the present invention. The pulse generator of this embodiment has the same construction as for the pulse generator shown in FIG. 8 with the exceptions that only one laser diode and system for driving the laser diode are provided, and laser light emitted from the laser diode is divided into two optical paths directed to each condenser lens. In the figure, equivalent constituent elements are identified by the same reference numerals.

Driver 6 drives LD 5 based on signals from SG 7. Half-mirror 14 is arranged in the path of laser light emitted from LD5; and condenser lens 4a and optical path length varying means composed of the above-described mirror 11, mirror unit 12, and mirror 13 are arranged in the optical path of laser light passing through half-mirror 14. Mirror 15 is provided in the optical path of laser light reflected by half-mirror 14, and the laser light reflected by this mirror 15 is focused by condenser lens 4b.

In a pulse generator constructed according to the foregoing description, as for the case of the above-described second embodiment, first short electrical pulses are generated in accordance with the irradiated optical pulses at first photoconductor section 3a, and second short electrical pulses are generated in accordance with the irradiated optical pulses at second photoconductor section 3b. Short electrical pulses that are the multiplied product of the first and second short electrical pulses are then detected in pulse width measuring device 9. In this embodiment as well, mirror unit 12 is used to adjust delay such that second short electrical pulses are generated in second photoconductor section 3b when first electrical pulses generated in first photoconductor section 3a arrive at second photoconductor section 3b.

The above-described configuration not only eliminates the need for a component that electrically generates a delay, but also enables a reduction in components such as driver circuits because only one semiconductor laser is needed.

Fourth Embodiment

In each of the above-described embodiments of a pulse generator, a portion of the electrical pulses generated on transmission lines is reflected by the end portions of the transmission lines, and this reflection can conceivably affect the waveform of the outputted electrical pulses.

Figure 10:
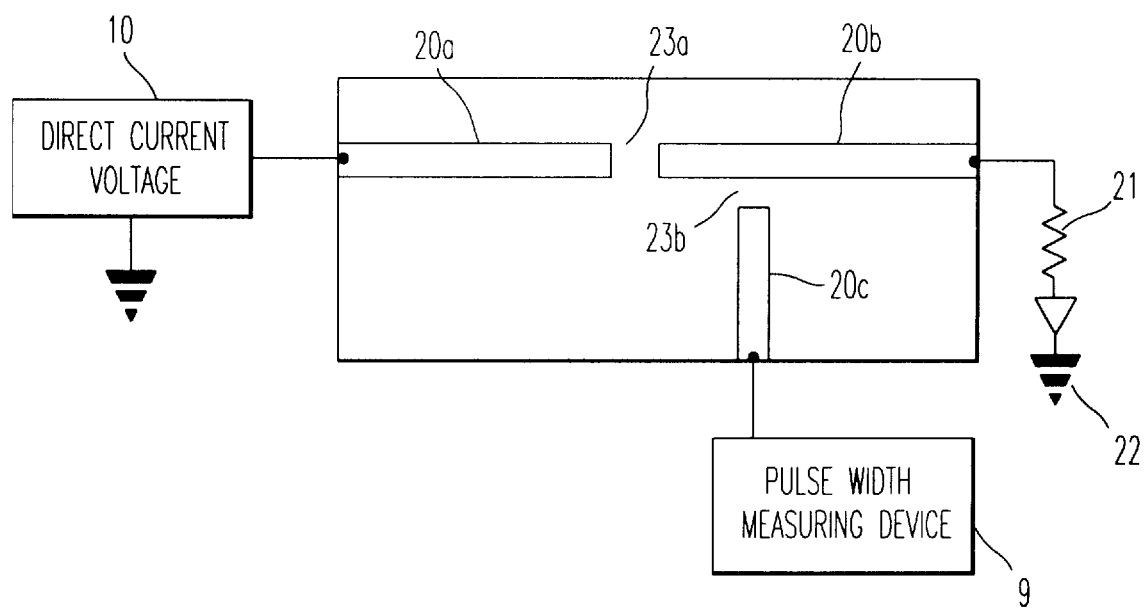
FIG. 10 is a schematic view showing the construction of a photoconductor of the fourth embodiment of the pulse generator of the present invention.

FIG. 10 shows the schematic construction of a photoconductor of a pulse generator according to the fourth embodiment of the present invention. In the figure, constituent elements equivalent to those of each of the above-described embodiments are identified with the same reference numerals.

In the pulse generator of this embodiment, each transmission line is arranged as described hereinbelow in order to eliminate reflection at end portions of the transmission lines.

Transmission lines 20a and 20b separated by a narrow gap are formed in a line on semi-insulating substrate, and transmission line 20c is formed in a direction perpendicular with respect to transmission line 20b and separated from transmission 20b by a narrow gap. Direct-current voltage 10 having a grounded feedback line is connected to transmission line 20a. Transmission line 20b is grounded by way of resistance 21 of 50 ( and diode 22. Transmission line 20c is connected to pulse width measuring device 9. Here, first photoconductor section 23a is formed between transmission lines 20a and 20b, and second photoconductor section 23b is formed between transmission lines 20b and 20c. Moreover, while optics such as laser diodes or a driving system are not shown in FIG. 10, optics equivalent to the optics shown in the above-described FIG. 2, FIG. 8, and FIG. 9 may be applied.

In a pulse generator equipped with a photoconductor configured according to the foregoing description, first short electrical pulses are generated in accordance with the irradiated optical pulses at first photoconductor section 23a, and second short electrical pulses are generated in accordance with the irradiated optical pulses at second photoconductor section 23b. Short electrical pulses which are the multiplied product of the first and second short electrical pulses are then detected in pulse width measuring device 9.

In this embodiment, delay may be adjusted by either varying the optical path length or through electrical adjustment such that second short electrical pulses are generated in second photoconductor section 23b when first electrical pulses generated in first photoconductor section 23a arrive in second photoconductor section 23b. Here, no reflection of electrical pulses generated at first photoconductor section 23a occurs at the end portion of transmission line 20b because the end portion of transmission line 20b is grounded by way of resistance 21 and diode 22.

Each of the embodiments of the pulse generator described hereinabove can be applied in high-speed sampling technology or radar technology, and in such applications, the present invention can provide a great technical effect due to a dramatic improvement in resolution.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A pulse generator comprising:
    an electrical pulse generation means that is provided with a photoconductor in which first to third transmission lines made up of conductive film are formed on a semi-insulating substrate and said transmission lines are separated by first and second narrow gaps, and that generates short electrical pulses on said first to third transmission lines in accordance with short optical pulses irradiated upon each narrow gap;
    short optical pulse irradiation means that is provided with a semiconductor laser and that irradiates short optical pulses upon said first and second narrow gaps; and
    delay means that gives a delay to short optical pulses irradiated upon one of said first and second narrow gaps such that pulse height of short electrical pulses generated on said first to third transmission lines is maximized.

2. A pulse generator according to claim 1 wherein said delay means is constructed so as to vary optical path length of short optical pulses irradiated upon one of said first and second narrow gaps.

3. A pulse generator according to claim 1 wherein said photoconductor is constructed such that reverse-bias voltage is impressed to one end of said first transmission line, and short electrical pulses generated on said first to third transmission lines are outputted from said third transmission line, and wherein said first to third transmission lines are formed in a line.

4. A pulse generator according to claim 1 wherein said photoconductor is constructed such that reverse-bias voltage is impressed to one end of said first transmission line, short electrical pulses generated on said first to third transmission lines are outputted from said third transmission line, said first and second transmission lines are formed in a line, one end of said second transmission line is grounded by way of a resistance and a diode, and said third transmission line is formed in a direction that forms a right angle with said second transmission line.

5. A pulse generator according to claim 1 wherein said semiconductor laser is a surface emitting laser diode, and the substrate upon which said surface emitting laser diode is formed is secured to said photoconductor by means of solder bumps.

6. A pulse generator according to claim 1 wherein said short optical pulse irradiation means comprises first and second semiconductor lasers that irradiate said first and second narrow gaps, respectively; and
    said delay means is constructed so as to electrically delay short optical pulses emitted from one of said first and second semiconductor lasers.

7. A pulse generator according to claim 6 wherein said first and second semiconductor lasers are surface emitting laser diodes, and the substrate on which these surface emitting laser diodes are formed is secured to said photoconductor by means of solder bumps.

8. A pulse generator constructed such that a plurality of pulse generators according to any of claims 1 to 7 are connected in parallel, and such that short electrical pulses outputted by these pulse generators are multiplied.

9. A pulse generation method wherein, using a photoconductor in which first to third transmission lines composed of a conductive film are formed on a semi-insulating substrate and the transmission lines are separated by first and second narrow gaps, short optical pulses are irradiated upon said first and second narrow gaps to bring about generation of first and second electrical pulses on the first to third transmission lines that accord with said short optical pulses, and these first and second electrical pulses are multiplied to obtain short electrical pulses; and wherein short optical pulses irradiated upon one of said first and second narrow gaps are delayed so as to maximize pulse height of said obtained short electrical pulses.

10. A pulse generation method according to claim 9 wherein said delay may be conferred by varying the optical path length of short optical pulses irradiated upon one of said first and second narrow gaps.

11. A pulse generation method according to claim 9 wherein said first and second semiconductor lasers that irradiate said first and second narrow gaps, respectively, are employed, and said delay is performed by conferring an electrical delay to one of said first and second semiconductor lasers.

* * * * *